(12) United States Patent
Tsai et al.

(10) Patent No.: US 9,076,734 B2
(45) Date of Patent: *Jul. 7, 2015

(54) DEFECT REDUCTION FOR FORMATION OF EPITAXIAL LAYER IN SOURCE AND DRAIN REGIONS

(71) Applicant: Taiwan Semiconductor Manufacturing Company, Ltd., Hsin-Chu (TW)

(72) Inventors: Chun Hsiung Tsai, Xinpu Township (TW); Chien-Chang Su, Kaohsiung (TW); Tsz-Mei Kwok, Hsin-Chu (TW)

(73) Assignee: Taiwan Semiconductor Manufacturing Company, Ltd., Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/506,368

(22) Filed: Oct. 3, 2014

(65) Prior Publication Data

US 2015/0024567 A1    Jan. 22, 2015

Related U.S. Application Data

(63) Continuation of application No. 13/743,926, filed on Jan. 17, 2013, now Pat. No. 8,853,039.

(51) Int. Cl.
| | |
|---|---|
| *H01L 29/66* | (2006.01) |
| *H01L 21/306* | (2006.01) |
| *H01L 21/8234* | (2006.01) |
| *H01L 29/78* | (2006.01) |

(52) U.S. Cl.
CPC .. *H01L 21/30604* (2013.01); *H01L 21/823412* (2013.01); *H01L 21/823425* (2013.01); *H01L 29/66636* (2013.01); *H01L 29/7834* (2013.01); *H01L 29/7848* (2013.01)

(58) Field of Classification Search
CPC .............. H01L 21/30604; H01L 29/66477
See application file for complete search history.

(56) References Cited

U.S. PATENT DOCUMENTS

| | | |
|---|---|---|
| 4,701,423 A | 10/1987 | Szluk |
| 5,710,450 A | 1/1998 | Chau et al. |
| 5,908,313 A | 6/1999 | Chau et al. |

(Continued)

OTHER PUBLICATIONS

Bauer, M., "High throughput SEG of highly in-situ doped SiCP/SiP layers for NMOS devices using a Si3H8/SiH3CH3/PH3/Cl2 based CDE process," 2012, pp. 499-506, vol. 50, Issue 9, The Electrochemical Society, Prime 2012.

(Continued)

*Primary Examiner* — Seahvosh Nikmanesh
(74) *Attorney, Agent, or Firm* — Slater & Matsil, L.L.P.

(57) ABSTRACT

The embodiments of mechanisms for forming source/drain (S/D) regions of field effect transistors (FETs) described enable forming an epitaxially grown silicon-containing layer with reduced number of particles on surface of recesses. The described mechanisms also reduce the effect of the residual particles on the epitaxial growth. The mechanisms include controlled etch of a native oxide layer on the surfaces of recesses to reduce creation of particles, and pre-CDE etch to remove particles from surface. The mechanisms also include reduced etch/deposition ratio(s) of initial CDE unit cycle(s) of CDE process to reduce the effect of residual particles on the formation of the epitaxially grown silicon-containing layer. With the application of one or more of the mechanisms, the quality of the epitaxial layer is improved.

20 Claims, 7 Drawing Sheets

(56) References Cited

U.S. PATENT DOCUMENTS

| | | |
|---|---|---|
| 6,137,149 A | 10/2000 | Kodama |
| 6,204,233 B1 | 3/2001 | Smith et al. |
| 6,232,641 B1 | 5/2001 | Miyano et al. |
| 6,238,989 B1 | 5/2001 | Wc Huang et al. |
| 6,274,894 B1 | 8/2001 | Wieczorek et al. |
| 6,368,927 B1 | 4/2002 | Lee |
| 7,030,012 B2 | 4/2006 | Divakaruni et al. |
| 7,195,985 B2 | 3/2007 | Murthy et al. |
| 7,652,328 B2 | 1/2010 | Yamasaki et al. |
| 7,772,097 B2 | 8/2010 | Tomasini et al. |
| 7,816,217 B2 | 10/2010 | Lin et al. |
| 7,910,445 B2 | 3/2011 | Onoda |
| 7,928,427 B1 | 4/2011 | Chang |
| 8,012,840 B2 | 9/2011 | Ando |
| 8,053,273 B2 | 11/2011 | Kammler et al. |
| 8,207,523 B2 | 6/2012 | Tsai et al. |
| 8,853,039 B2 * | 10/2014 | Tsai et al. ............ 438/300 |
| 2001/0023108 A1 | 9/2001 | Miyano et al. |
| 2003/0148563 A1 | 8/2003 | Nishiyama |
| 2005/0035408 A1 | 2/2005 | Wang et al. |
| 2005/0077570 A1 | 4/2005 | Nishinohara |
| 2005/0095799 A1 | 5/2005 | Wang et al. |
| 2005/0158931 A1 | 7/2005 | Chen et al. |
| 2006/0084235 A1 | 4/2006 | Barr et al. |
| 2006/0088968 A1 | 4/2006 | Shin et al. |
| 2006/0115933 A1 | 6/2006 | Ye et al. |
| 2006/0131665 A1 | 6/2006 | Murthy et al. |
| 2006/0148151 A1 | 7/2006 | Murthy et al. |
| 2006/0166414 A1 | 7/2006 | Carlson et al. |
| 2006/0228842 A1 | 10/2006 | Zhang et al. |
| 2006/0234504 A1 | 10/2006 | Bauer et al. |
| 2006/0289902 A1 | 12/2006 | Ping et al. |
| 2007/0096194 A1 | 5/2007 | Streck et al. |
| 2007/0148919 A1 | 6/2007 | Lin et al. |
| 2007/0200176 A1 | 8/2007 | Kammler et al. |
| 2007/0259501 A1 | 11/2007 | Xiong et al. |
| 2007/0287272 A1 | 12/2007 | Bauer et al. |
| 2008/0085577 A1 | 4/2008 | Shih et al. |
| 2008/0157091 A1 | 7/2008 | Shin et al. |
| 2008/0224212 A1 | 9/2008 | Lee et al. |
| 2009/0020820 A1 | 1/2009 | Baik et al. |
| 2009/0075029 A1 | 3/2009 | Thomas et al. |
| 2009/0085125 A1 | 4/2009 | Kim et al. |
| 2009/0236633 A1 | 9/2009 | Chuang et al. |
| 2009/0267118 A1 | 10/2009 | Chakravarti et al. |
| 2010/0025779 A1 | 2/2010 | Kammler et al. |
| 2010/0193882 A1 | 8/2010 | Hoentschel et al. |
| 2010/0219475 A1 | 9/2010 | Kronholz et al. |
| 2010/0221883 A1 | 9/2010 | Kronholz et al. |
| 2010/0244107 A1 | 9/2010 | Kronholz et al. |
| 2011/0117732 A1 | 5/2011 | Bauer et al. |
| 2011/0124169 A1 | 5/2011 | Ye et al. |
| 2011/0147828 A1 | 6/2011 | Murthy et al. |
| 2011/0212584 A9 | 9/2011 | Chakravarthi et al. |
| 2011/0266617 A1 | 11/2011 | Nakazawa et al. |
| 2011/0269287 A1 | 11/2011 | Tsai et al. |
| 2012/0032275 A1 | 2/2012 | Haran et al. |
| 2012/0056245 A1 | 3/2012 | Kang et al. |
| 2012/0104498 A1 | 5/2012 | Majumdar et al. |
| 2012/0181625 A1 | 7/2012 | Kwok et al. |
| 2012/0295421 A1 | 11/2012 | Brabant et al. |
| 2013/0056795 A1 | 3/2013 | Wu et al. |
| 2013/0157431 A1 | 6/2013 | Tsai et al. |
| 2013/0307076 A1 | 11/2013 | Cheng et al. |
| 2013/0328126 A1 | 12/2013 | Tsai et al. |
| 2014/0170840 A1 | 6/2014 | Tsai et al. |
| 2014/0198825 A1 | 7/2014 | Tsai et al. |

OTHER PUBLICATIONS

Fischer, P.R., et al. "Low Temperature Silcore Deposition of Undoped and Doped Silicon Films," ECS Transactions, 3(2) 203-215, Mar. 2006.

* cited by examiner

DEFECT REDUCTION FOR FORMATION OF EPITAXIAL LAYER IN SOURCE AND DRAIN REGIONS

PRIORITY CLAIM AND CROSS-REFERENCE

The present application is a continuation of U.S. application Ser. No. 13/743,926, entitled "Defect Reduction for Formation of Epitaxial Layer in Source and Drain Regions," filed on Jan. 17, 2013, now U.S. Pat. No. 8,853,039 B2, which is incorporated herein by reference.

The present application is related to U.S. application Ser. No. 13/493,626, entitled "EPITAXIAL FORMATION OF SOURCE AND DRAIN REGIONS," filed on Jun. 11, 2012. The present application is also related to U.S. application Ser. No. 13/719,826, entitled "Epitaxial Formation Mechanisms of Source and Drain Regions" and filed on Dec. 19, 2012, and U.S. application Ser. No. 13/739,781 entitled "Epitaxial Formation Mechanisms of Source and Drain Regions," and filed on Jan. 11, 2013. The above-mentioned applications are incorporated herein by reference in their entireties.

TECHNICAL FIELD

The present disclosure relates generally to the field of semiconductor devices and, more particularly, to integrated circuits and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
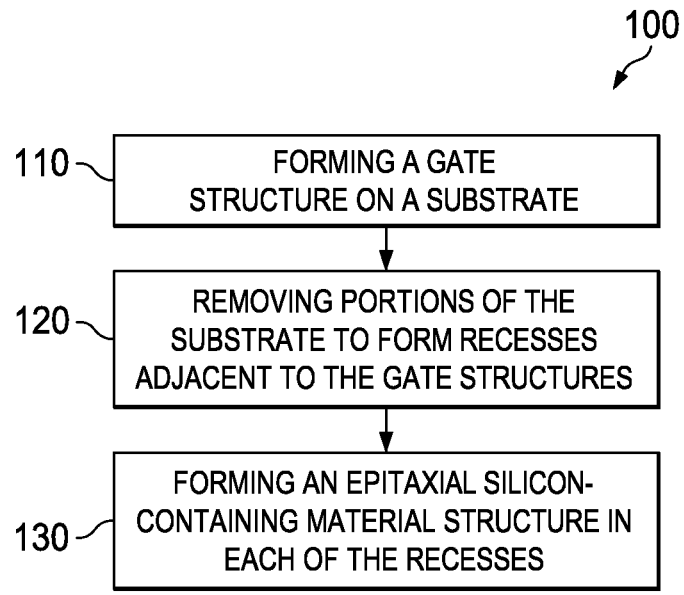
FIG. 1 is a flowchart illustrating an exemplary method of forming an integrated circuit.

It is understood that the following description provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

As semiconductor devices, such as metal-oxide-semiconductor field effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often epitaxially grows silicon (Si) to form raised source and drain features for an n-type device, and epitaxially grows silicon germanium (SiGe) to form raised source and drain features for a p-type device. Various techniques directed at shapes, configurations, and materials of these source and drain features have been implemented to further improve transistor device performance. Although existing approaches have been generally adequate for their intended purposes, they have not been entirely satisfactory in all respects.

The embodiments will be described with respect to specific embodiments in a specific context, namely a source/drain region for a complementary metal-oxide semiconductor (CMOS) transistor. The embodiments may also be applied, however, to other doped regions within a semiconductor device.

Illustrated in FIG. 1 is a flowchart of a method of forming an integrated circuit, in accordance with some embodiments. FIGS. 2A-2E are schematic cross-sectional views of an integrated circuit during various fabrication stages, in accordance with some embodiments. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2E have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a gate structure over a substrate (block 110). The method 100 can include removing portions of the substrate to form recesses adjacent to the gate structure (block 120). The method 100 can also include forming a silicon-containing material structure in each of the recesses (block 130).

Figure 2A:
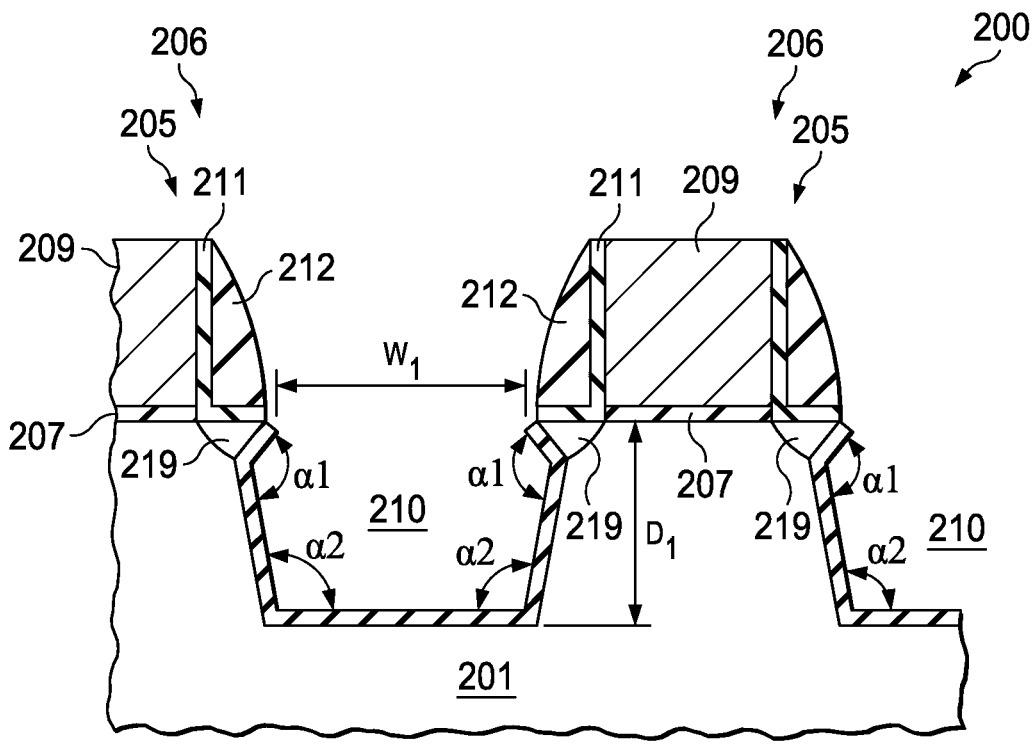
FIGS. 2A-2E are cross-sectional views of an integrated circuit during various fabrication stages, in accordance with some embodiments.

Referring now to FIGS. 2A-2E in conjunction with FIG. 1, an integrated circuit 200 can be fabricated in accordance with the method 100 of FIG. 1. In FIG. 2A, the integrated circuit 200 can be built on a substrate 201. Substrate 201 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Substrate 201 may include an epitaxial layer (epi layer), and may be strained for performance enhancement.

In some embodiments forming n-type transistors, the substrate 201 can be a silicon substrate doped with a p-type dopant, such as boron (resulting in a p-type substrate). A metal gate structure can have a stack structure including a high dielectric constant gate layer, a diffusion barrier layer, a metal work function layer, a metallic layer, and/or other suitable layers. A dummy gate structure can have a stack structure including a dummy material layer, a hard mask layer, and/or other suitable layers.

In some embodiments, a gate stack 205 comprising a gate dielectric 207, a gate electrode 209, first spacers 211, and second spacers 212 may be formed over the substrate 201. The gate dielectric layer 207 includes a dielectric material, such as silicon oxide, silicon oxynitride, silicon nitride, a high-k dielectric material, or combinations thereof. Exemplary high-k dielectric materials include hafnium oxide ($HfO_2$), aluminum oxide ($Al_2O_3$), zirconium oxide ($ZrO_2$), gallium oxide ($Ga_2O_3$), titanium oxide ($TiO_2$), lanthanum oxide ($La_2O_3$), tantalum oxide ($Ta_2O_5$), gadolinium oxide ($Gd_2O_3$), yttrium oxide ($Y_2O_3$), hafnium dioxide-alumina ($HfO_2$—$Al_2O_3$) alloy, hafnium aluminum oxide (HfAlO), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), titanium aluminum oxide (TiAlO), lanthanum aluminum oxide (such as $LaAlO_3$), other high-k dielectric material, or combinations thereof. The gate dielectric layer 207 may include a multilayer structure. For example, the gate dielectric layer 207 may include an interfacial layer formed over the substrate 201, and a high-k dielectric layer formed over the interfacial layer. The interfacial layer may be a silicon oxide layer formed by a thermal process or ALD process.

The gate electrode layer 209 is disposed over the gate dielectric layer 207. The gate electrode layer 209 includes a conductive material, such as polycrystalline silicon (polysilicon), aluminum (Al), copper (Cu), titanium (Ti), tantalum (Ta), tungsten (W), molybdenum (Mo), platinum (Pt), tantalum nitride (TaN), titanium nitride (TiN), tungsten nitride (WN), titanium aluminum (TiAl), titanium aluminum nitride (TiAlN), TaCN, TaC, TaSiN, other conductive material, or combinations thereof. The conductive material of the gate electrode layer 209 may be doped or undoped depending on design requirements of field effect transistor devices of integrated circuit 200. In some embodiments, the gate electrode layer 209 includes a work function layer tuned to have a proper work function for enhanced performance of the field effect transistor devices of integrated circuit 200. For example, in the depicted embodiment, where the field effect transistor devices are NFETs, the work function layer includes an n-type work function metal (n-metal), such as Ta, TiAl, TiAlN, TaCN, other n-type work function metal, or a combination thereof. Where the field effect transistor device is a PFET, the work function layer includes a p-type work function metal (p-metal), such as TiN, TaN, other p-type work function metal, or combination thereof. In furtherance of the present example, a conductive layer, such as an aluminum layer, is formed over the work function layer, such that the gate electrode layer 209 includes a work function layer disposed over the gate dielectric layer 207 and a conductive layer disposed over the work function layer.

Surrounding the gate stack 205 are the first spacers 211 and the second spacers 212. The gate stack 205 and the surrounding spacers, such as spacers 211 and 212, form a gate structure 206. The spacer layers may comprise SiN, oxynitride, SiC, SiON, oxide, and the like. However, as one of ordinary skill in the art will recognize, the first spacers 211 and the second spacers 212 as illustrated in FIG. 2A are intended to be merely illustrative and are not intended to limit the embodiments to these descriptions. Rather, any suitable number and combination of spacer layers and shapes may be utilized in order to form spacers for the gate stack 205, and any suitable combination of spacers may alternatively be utilized.

In some embodiments of forming an n-type transistor, n-type lightly-doped drains (LDDs) 219 can be formed in the substrate 201. Portions of the n-type LDDs 219 can be formed under the gate structure 205. The n-type LDDs 219 can be formed of n-type dopants (impurities). For example, the dopants can comprise phosphorous, arsenic, and/or other group V elements. In some embodiments, at least one thermal annealing process, e.g., a rapid thermal annealing (RTA) process, can be performed to activate the dopants of the n-type LDDs 219. In some embodiments of forming an n-type transistor, p-type pocket doped regions (not shown) can be formed in the substrate 201. The p-type pocket doped regions can be formed of p-type dopants (impurities). For example, the dopants can comprise boron and/or other group III elements.

FIG. 2A illustrates the formation of recesses 210 within the substrate 201. The recesses 210 may be formed using, e.g., a wet etch process selective to the material of the substrate 201 and uses the gate stack 205, the first spacers 211, and the second spacers 212 as a hard mask in order to form the recesses 210. For example, an etchant such as carbon tetrafluoride ($CF_4$), HF, tetramethylammonium hydroxide (TMAH), or combinations of thereof, or the like may be used to perform the wet etch and form the recesses 210. The recesses 210 provide openings in the substrate 201 into which source/drain regions (whose formation is described further below with respect to FIGS. 2B-2E) will subsequently be formed.

Recess 210, formed below and between a spacer 212 surrounding gate structure 205 and a neighboring spacer 212 as shown in FIG. 2A, has a width $W_1$ of between about 50 Å and about 5000 Å, in accordance with some embodiments. Recesses 210 may additionally undercut the first spacers 211 and/or the second spacers 212. Additionally, the wet etch process may be continued until the recesses 210 have a depth $D_1$ from a surface of the substrate 201. In some embodiments, $D_1$ is in a range from about 50 Å and about 600 Å. However, these dimensions are not intended to limit the present embodiments, as any suitable dimensions for the recesses 210 may alternatively be utilized.

The recesses 210 may be formed to have either an angular or rounded shape. In an embodiment in which the recesses 210 have an angular shape, the recesses 210 may be formed to have a first angle $\alpha_1$ along the top of the recesses 210 and a second angle $\alpha_2$ along the bottom of the recesses 210. In some embodiments, the first angle $\alpha_1$ is in a range from about 90° and about 180°. The second angle $\alpha_2$ is in a range from about 85° and about 170°, in accordance with some embodiments.

Referring to FIGS. 1 and 2B-2E, the method 100 can include forming an epitaxial silicon-containing material structure in each of the recesses (block 130). In some embodiments, the block 130 can include performing an epitaxial deposition/partial etch process and repeating the epitaxial deposition/partial etch process at least once. Such repeated deposition/partial etch process is also called a cyclic deposition/etch (or deposition and etch) (CDE) process.

Figure 2B:
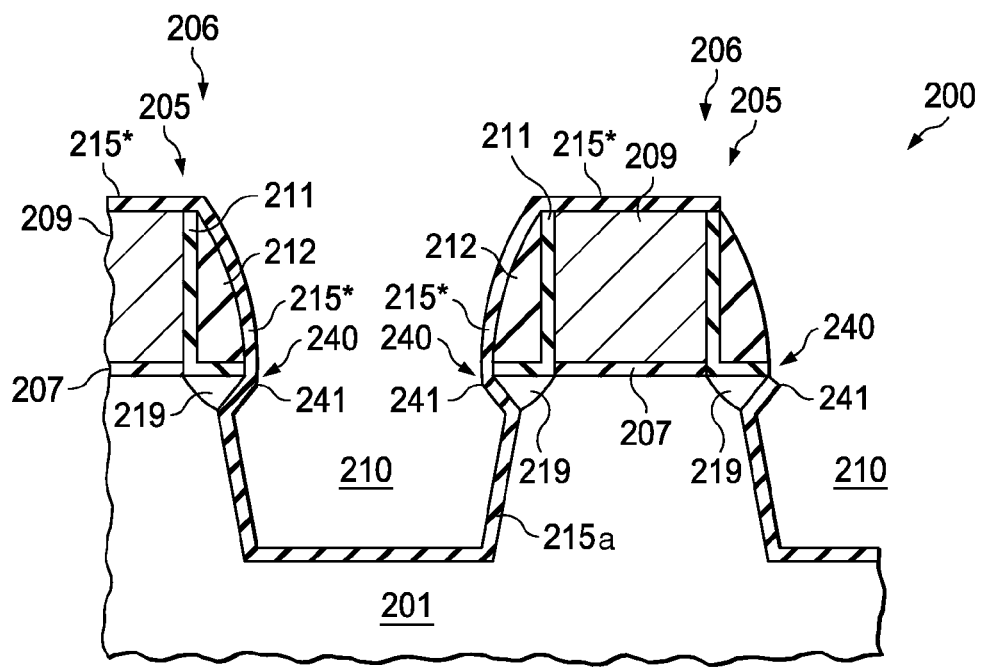
Figure 2C:
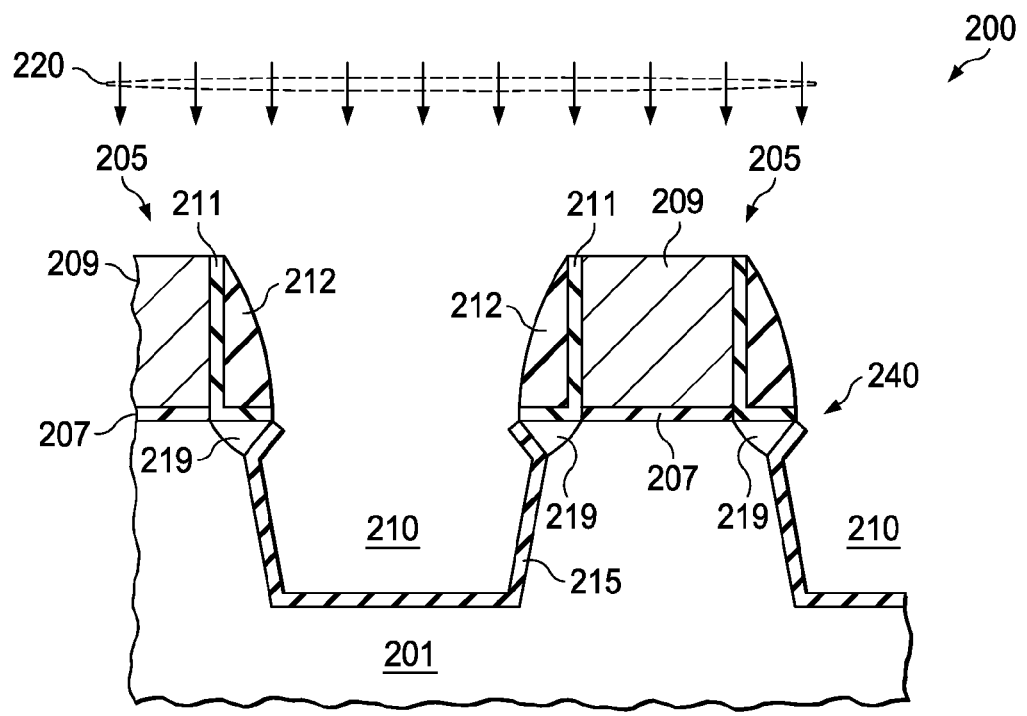
Figure 2D:
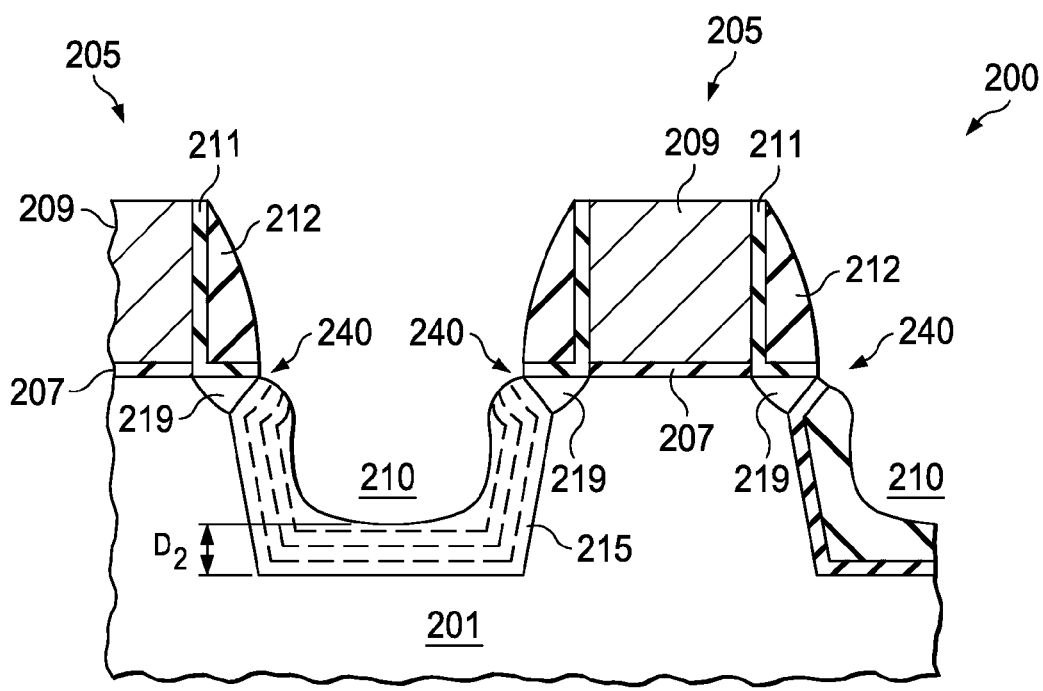
Figure 2E:
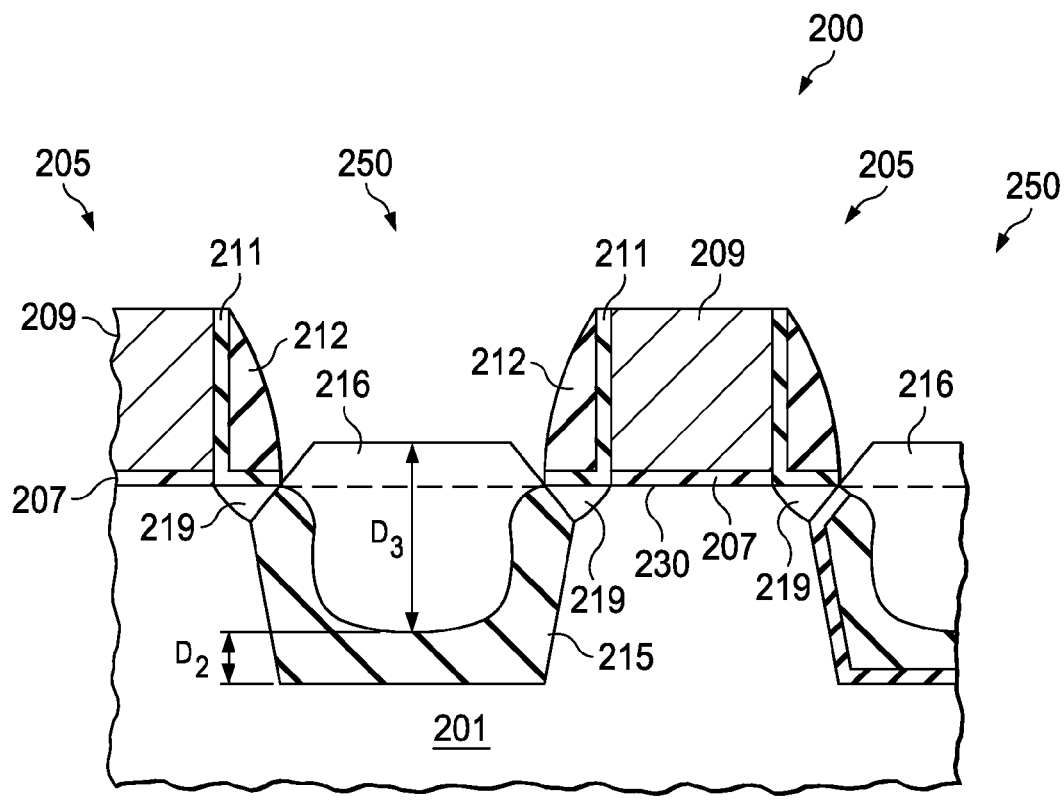

The block 130 may include epitaxially depositing a silicon-containing material (or layer) 215, in recesses 210 as shown in FIGS. 2B-2D, in accordance with some embodiments. Block 130 also may include depositing a silicon-containing layer 216 over the silicon-containing material 215 in recesses 210, as shown in FIG. 2E, in accordance with some embodiments.

The deposition of the silicon-containing material 215 includes in-situ doping the silicon-containing material 215, in accordance with some embodiments. For example, forming an n-type transistor can use an n-type doping precursor, e.g., phosphine ($PH_3$) and/or other n-type doping precursor. By using the in-situ doping process, the dopant profile of the silicon-containing material 215 can be desirably achieved. In some embodiments, the silicon-containing material 215 can be an n-type doped silicon layer that is doped with phosphorus (Si:P). In some embodiments, the silicon-containing material 215 can be an n-type doped silicon layer that is doped with both phosphorus and carbon (Si:CP). Carbon could impede the out-diffusion of phosphorus from the silicon-containing material 215. Other types of dopants may also be included. In some embodiments, the phosphorus dopant has a concentration in a range from about 0.1% to about 5% (atomic percent). In some embodiments, the carbon dopant has a concentration in a range from about 0.1% to about 5% (atomic percent).

In some embodiments, the silicon-containing material 215 can be formed by chemical vapor deposition (CVD), e.g., low pressure CVD (LPCVD), atomic layer CVD (ALCVD), ultrahigh vacuum CVD (UHVCVD), reduced pressure CVD (RPCVD), any suitable CVD; molecular beam epitaxy (MBE) processes; any suitable epitaxial process; or any combinations thereof. In some embodiments, the deposition of the silicon-containing material 215 can have a deposition temperature of about 750° C. or less. In other embodiments, the deposition temperature ranges from about 500° C. to about 750° C. The pressure of the deposition process can range from about 5 Torr to about 500 Torr.

The deposition of the silicon-containing material 215 can use at least one silicon-containing precursor, such as silane ($SiH_4$), disilane ($Si_2H_6$), trisilane ($Si_3H_8$), Dichlorosilane ($SiH_2Cl_2$), another silicon-containing precursor, and/or any combinations thereof. In some embodiments, the silicon-containing precursor can have a flow rate ranging from about 20 standard cubic centimeters per minute (sccm) to about 500 sccm. In other embodiments forming a p-type transistor, the silicon-containing material 215 can be made of at least one material, such as silicon, silicon germanium, other semiconductor materials, and/or any combinations thereof.

As mentioned above, the deposition of the silicon-containing material 215 includes in-situ doping the silicon-containing material 215, in accordance with some embodiments. For example, forming an n-type transistor can use an n-type doping precursor, e.g., phosphorous-containing gases such as phosphine ($PH_3$), arsenic-containing gases such as arsine ($AsH_3$), other n-type dopant-containing gases, or a combination thereof. In some embodiments, the n-type doping precursor can have a flow rate ranging from about 20 sccm to about 500 sccm. A carbon-containing gas, such as monomethylsilane (MMS), is also included to dope the silicon-containing material 215 with carbon, in accordance with some embodiments. In some embodiments, the carbon-containing gas has a flow rate ranging from about 10 sccm to about 600 sccm.

The silicon-containing material 215 in recesses 210 is epitaxial. The deposition process forms a thin epitaxial layer 215a of silicon-containing material in recesses 210 and an amorphous silicon-containing material 215* on gate electrode 209 and spacers 212, as shown in FIG. 2B in accordance with some embodiments. Referring to FIG. 2C, an etching (or partial etching) process 220 removes the amorphous silicon-containing material 215* and also a portion of the silicon-containing material 215a in recesses 210. The remaining silicon-containing material 215 is formed in each of the recesses 210. In some embodiments, the etching process 220 can use an etching gas including at least one of hydrogen chloride (HCl), chlorine ($Cl_2$), germanium hydride ($GeH_4$), other suitable etching gases, and/or any combinations thereof. The flow rate of the etching gas can range from about 50 sccm to about 750 sccm, in accordance with some embodiments. In some embodiments, the pressure of the etching process 220 ranges from about 5 Torr to about 500 Torr. In some embodiments, the etching process 220 can have an etching temperature of about 590° C. or less. In other embodiments, the etching temperature can range from about 500° C. to about 590° C. The process temperatures and pressures for the deposition process and etch process to form the silicon-containing material 215 are identical in some embodiments.

The etching process 220 would remove the amorphous silicon-containing material 215* over non-crystalline surface at a rate higher than the removal rate of epitaxial silicon-containing material 215. In addition, the etching process would remove a portion of epitaxial silicon-containing material 215 including the dislocations 241 near the gate corners 240.

The epitaxial deposition/partial etch process is repeated a number of times until a desired thickness $D_2$ is reached, as shown in FIG. 2D in accordance with some embodiments. As a result, such repeated deposition/partial etch process is called a cyclic deposition/etch (CDE) process. In some embodiments, $D_2$ is in a range from about 10 Å and about 500

Å. The dotted lines in recesses 210 are used to illustrate the multiple sub-layers formed by the epitaxial CDE process.

As mentioned above, the silicon-containing material 215 can be an n-type doped silicon layer that is doped with both phosphorus and carbon, in accordance with some embodiments. Carbon could impede the out-diffusion of phosphorus from the silicon-containing material 215. The phosphorus- and carbon-doped silicon layer can be referred to as a Si:CP layer. The dopants in the silicon-containing material 215 deposited by CDE have higher level of activation than implanted dopants. In some embodiments, the dopant activation level is in a range from about 2E20 atoms/cm$^3$ to about 6E20 atoms/cm$^3$. In contrast, the activation of implanted dopant at S/D is typically at about 1E20 to 2E20 atoms/cm$^3$ level. The higher activation level makes formation of in-situ doping of epitaxial grown silicon-containing desirable.

Following the CDE process, a selective epitaxial growth (SEG) process may be used to deposit additional silicon-containing film to fill the remaining recesses 210. The SEG process has a higher growth rate than the CDE process, in accordance with some embodiments. The SEG process is a selective deposition process and the silicon-containing film formed by this process deposits on epitaxial silicon-containing film, such as layer 215. SEG processes utilize simultaneous deposition and etch. In some embodiments, the surface of the silicon-containing layer 216, which is epitaxial, is leveled with silicon substrate surface 230. In some embodiments, the surface of the silicon-containing layer 216 is above silicon substrate surface 230, as shown in FIG. 2E. The thickness $D_3$ of the silicon-containing layer 216 is in a range from about 30 Å to about 400 Å, in some embodiments. In some embodiments, the silicon-containing layer 216 is doped with phosphorus (Si:P).

Layer 215 and layer 216 form the S/D regions 250. In some embodiments, the material and/or method of forming the silicon-containing layer 216 can be the same as or similar to those of the silicon-containing material 215. In some embodiments, the silicon-containing layer 216 may have a dopant concentration different from that of the silicon-containing material 215.

Figure 3A:
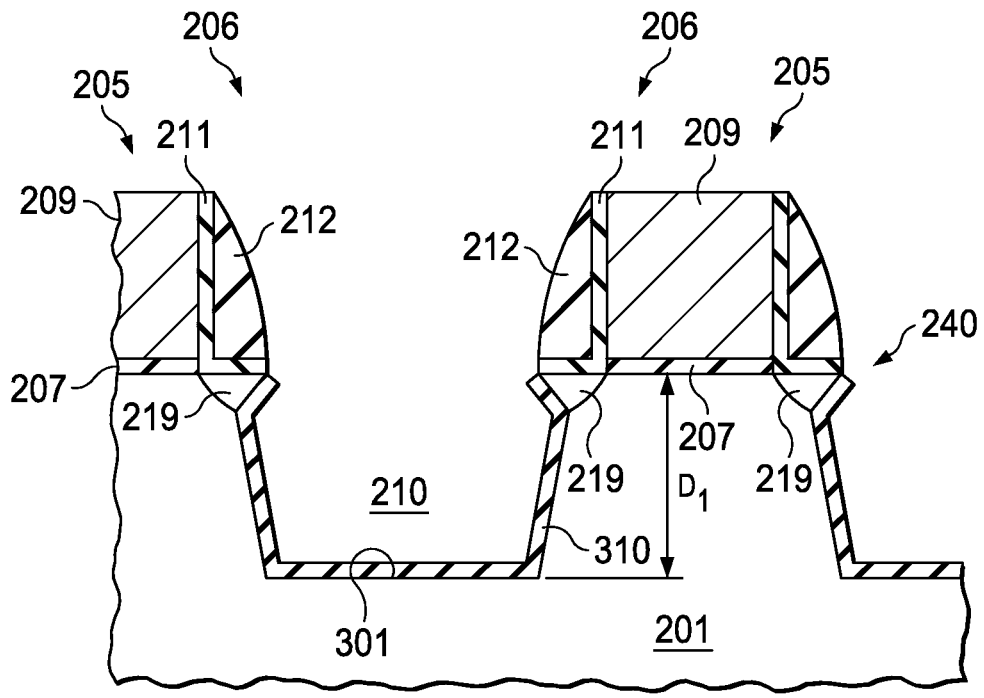
FIG. 3A shows a native oxide layer on a surface of a recess in a semiconductor substrate, in accordance with some embodiments.

As described above in FIG. 2A, recesses 210 are formed using, e.g., a wet etch process selective to the material of the substrate 201, in accordance with some embodiments. For example, an etchant such as carbon tetrafluoride (CF$_4$), HF, tetramethylammonium hydroxide (TMAH), or combinations of thereof, or the like may be used to perform the wet etch and form the recesses 210. After recesses 210 are formed, a thin layer 310 of native oxide is formed on silicon surface 301 due to the exposure of fresh silicon surface to oxygen-containing environment, as shown in FIG. 3A in accordance with some embodiments. In some embodiments, the native oxide layer 310 has a thickness in a range from about 5 Å to about 20 Å.

Figure 3B:
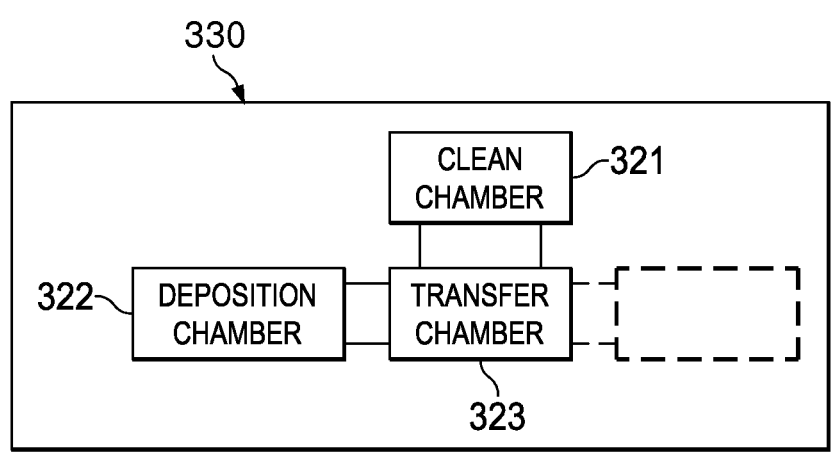
FIG. 3B shows an integrated processing system, in accordance with some embodiments.

Prior to forming the silicon-containing layer 215, the native oxide layer 310 needs to be removed. For advanced semiconductor processing, a dry etch employing an etching plasma is used, in some embodiments. Using a dry etching process enables the etch chamber to be integrated with a deposition chamber. Such an integrated system allows the substrate to travel from the etch chamber to a deposition chamber to form layer 215 under vacuum, which greatly reduces the risk of reformation of the thin native oxide and improves the quality of the silicon-containing layer 215. FIG. 3B shows an integrated processing system 330, in accordance with some embodiments. System 330 include an etch chamber 321, which is configured to use dry etch plasma to remove the above-mentioned thin oxide layer 310. System 330 also includes a deposition chamber 322, which is configured to deposit the silicon-containing layer 215. Etch chamber 321 and deposition chamber 322 are connected to a transfer chamber 323, in accordance with some embodiments. A substrate (or wafer) (not shown), after being cleaned can be moved from etch chamber 321 to deposition chamber 322 via the transfer chamber 323 under vacuum. As a result, the cleaned substrate is not exposed to the atmospheric environment, and a native oxide layer does not reform prior to the formation of the silicon-containing layer 215 in the deposition chamber 322.

The native oxide layer 310 is removed by a plasma etch process, in accordance with some embodiments. The plasma etchant is formed by plasmarized gas mixture of NF$_3$ and NH$_3$, in accordance with some embodiments. In some embodiments, the plasma is generated remotely (remote plasma). In some other embodiments, the plasma is generated in-situ (in the process chamber). Equation (1) shows etch radicals (NH$_4$F+NH$_4$F.HF) formed by plasmarized NF$_3$ and NH$_3$, in accordance with some embodiments.

$$NF_3 + NH_3 \rightarrow NH_4F + NH_4F.HF \qquad (1)$$

The radicals react with the native oxide (SiO$_2$) as shown in equation (2), in accordance with some embodiments.

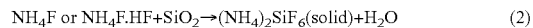

$$NH_4F \text{ or } NH_4F.HF + SiO_2 \rightarrow (NH_4)_2SiF_6(solid) + H_2O \qquad (2)$$

The solid etch product (NH$_4$)$_2$SiF$_6$ evaporates as gases under thermal anneal. For example, (NH$_4$)$_2$SiF$_6$ decomposes into SiF$_4$, NH$_3$, and HF at temperature in a range from about 80° C. to about 300° C., under a pressure in a range from about 0.1 Torr to about 10 Torr. Equation (3) shows the reaction in accordance with some embodiments.

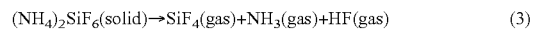

$$(NH_4)_2SiF_6(solid) \rightarrow SiF_4(gas) + NH_3(gas) + HF(gas) \qquad (3)$$

Figure 3C:
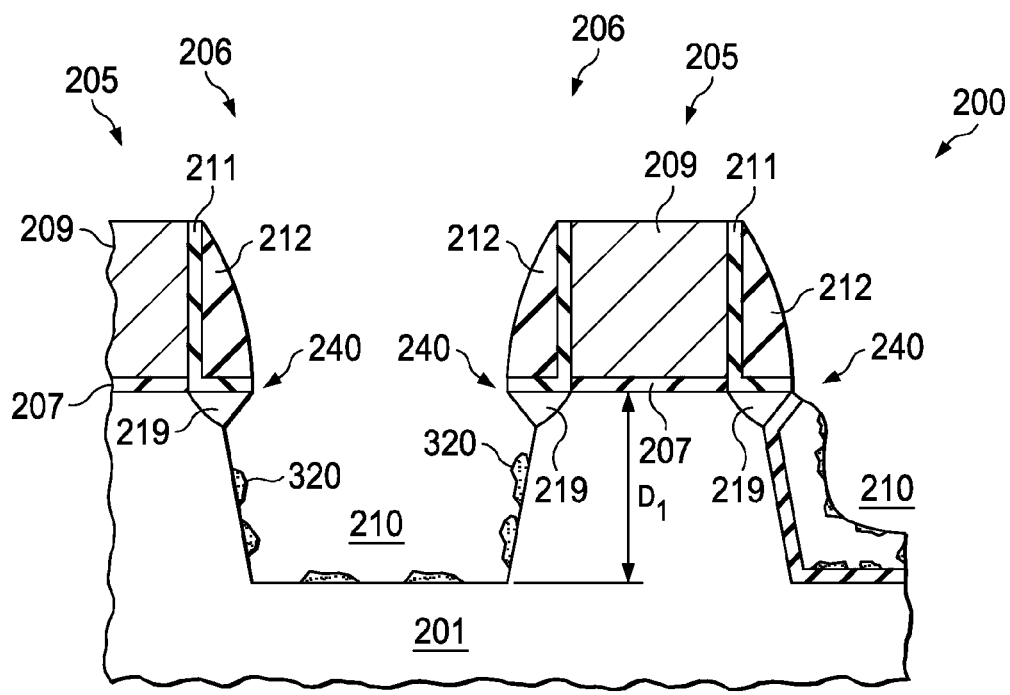
FIG. 3C shows particles (defects) on a surface of a recess in a semiconductor substrate, in accordance with some embodiments.

The plasma etch process is designed to remove native oxide SiO$_2$. However, if the etch process is conducted too long (too much over-etch), the etch plasma would react with other reactable materials, such as SiN of spacers 212 or residual photoresist byproduct from the patterning process. The unintended reactions between the etch plasma and SiN or photoresist byproduct would produce an un-desired etch product, which is not (NH$_4$)$_2$SiF$_6$ and would not break down into gaseous species under the anneal condition described above. As a result, some etch product would remain in solid form as particles (defects) 320 on the cleaned recess surface 301' after the dry plasma process used to remove native oxide layer 310 is completed, as shown in FIG. 3C in accordance with some embodiments. Particles 320 remaining in recess 210 would interfere with the epitaxial growth of silicon-containing layer 215.

A certain degree of over-etch of the native oxide layer 310 is needed to address the issues of non-uniformity in thickness of native oxide layer 310 and non-uniformities in the etch process across substrate 201. However, the over-etch should be controlled to limit the formation of un-wanted solid etch product 320 described above. In some embodiments, the over-etch amount is between about 20% to about 50% of the average thickness of the native oxide layer 310.

Figure 4:
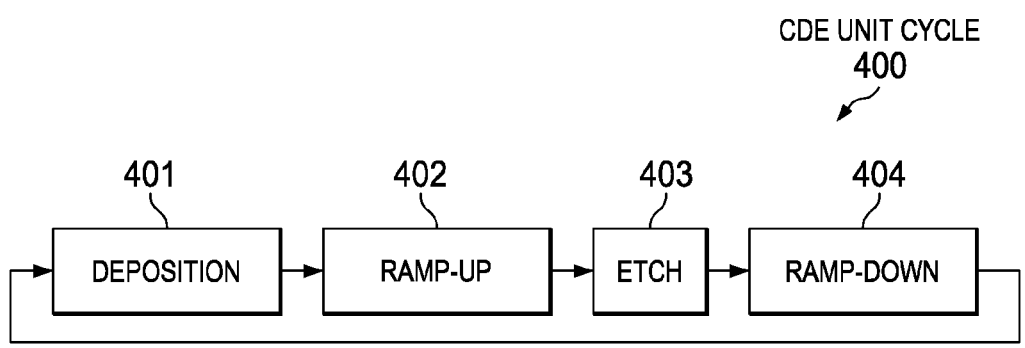
FIG. 4 shows the process sequence of a cyclic deposition and etch (CDE) process, in accordance with some embodiments.

After the native oxide layer 310 is removed with the targeted over-etch described above, the substrate is sent to the deposition chamber 322 for forming the silicon-containing layer 215. Deposition chamber 322 is configured to perform the CDE process to form layer 215 described above. In some embodiments, deposition chamber 322 is also configured to perform the SEG process to form layer 216 described above. FIG. 4 shows the process sequence of a CDE process 400 in deposition process chamber 322, in accordance with some embodiments. The process 400 includes a deposition operation 401, a temperature ramp-up operation 402, an isothermal etch operation 403, and a temperature ramp-down operation 404, in accordance with some embodiments. As mentioned above, the deposition operation 401 employs a silicon-containing gas, such as trisilane ($Si_3H_8$), di-silane ($Si_2H_6$), etc., as silicon source, and a dopant gas, such as $PH_3$, is also used to provide a dopant for the deposited silicon-containing material layer. In some embodiments, the pressure of the etching process 220 ranges from about 10 Torr to about 500 Torr. In some embodiments, the etching temperature can range from about 600° C. to about 750° C. In some embodiments, the deposition time is in a range from about 3 seconds to about 20 seconds. In some embodiments, the amount of the silicon-containing material 215 deposited in operation 401 is in a range from about 5 Å to about 80 Å during each CDE unit cycle, in accordance with some embodiments.

After deposition operation 401, a temperature ramp-up operation 402 is used to increase the temperature(s) of the process chamber and the substrate to a targeted etch temperature. In some embodiments, the etch gas is introduced in this operation to start the etching process and to shorten etch time. Once the targeted temperature is reached, the isothermal etch operation 403 follows. In some embodiments, the etch gas(es) include HCl. A non-reactive carrier gas, such as an inert gas, or $N_2$, is also used in the etch gas mixture in accordance with some embodiments. The duration of the temperature ramp-up operation 402, where etch occurs, is in a range from about 10 seconds to about 50 seconds, in accordance with some embodiments. The duration of the isothermal etch operation 403 is in a range from about 2 seconds to about 30 seconds, in some embodiments.

The amount of the silicon-containing material 215 removed in operations 402 and 403 is in a range from about 5 Å and about 30 Å during each CDE unit cycle, in accordance with some embodiments. After the isothermal etching operation 403, the temperature ramp-down operation 404 follows to remove the etching gases and to lower the process temperature to deposition temperature for next CDE unit cycle.

As described above, the deposition system 322 is equipped with HCl gas, which can be used to remove (or etch) oxide or non-oxide residue at an elevated temperature, such as at a temperature equal to or greater than about 500° C. HCl dissociates at high temperature and dissociated HCl can be used as an etchant to remove residues 320 on surface 301'. In some embodiments, a HCl etch process is performed on the substrate prior to the CDE process. The HCl etch process is performed at a temperature in a range from about 500° C. to about 590° C., in some embodiments. The pressure of the process is in a range from about 10 Torr to about 500 Torr. The flow rate of HCl is in a range from about 50 sccm to about 1000 sccm. The etch time is in a range from about 10 seconds to about 200 seconds, in some embodiments. In some embodiments, a carrier gas is mixed with HCl. In some embodiments, the carrier gas is $H_2$. The usage of the HCl etch would further reduce the number of particles (or solid etch product) on surface 301' of recesses 210.

After the HCl etch (or pre-CDE etch) process described above is performed, the CDE process can start. As mentioned above, the CDE process involves repeating a number of CDE unit cycles. In some embodiments, each CDE unit cycle performed is the same and the same CDE unit cycle is repeated a number of times. Although particles 320 on surface 301' of recesses 210 are reduced by the etch processes described above, a limited number of particles 320 might still remain on surface 301'. As mentioned above, the remaining particles 320 could interfere with the growth and quality of silicon-containing layer 215. In order to reduce the impact of the remaining particles 320 on the growth of epitaxial silicon-containing layer 215, the initial CDE unit cycle(s) can be tuned to favor growth by reducing the etching amount to achieve a lower etch to deposition ratio (or to lower the E/D ratio). The CDE unit cycle with a lower E/D ratio can repeat for one to two cycles until the presence of particles 320 is reduced to almost none. Afterwards, CDE unit cycles with a normal E/D ratio, which is higher than the initial CDE unit cycle(s), are used until the growth of silicon-containing layer 215 has reached the targeted thickness $D_2$.

Figure 5A:
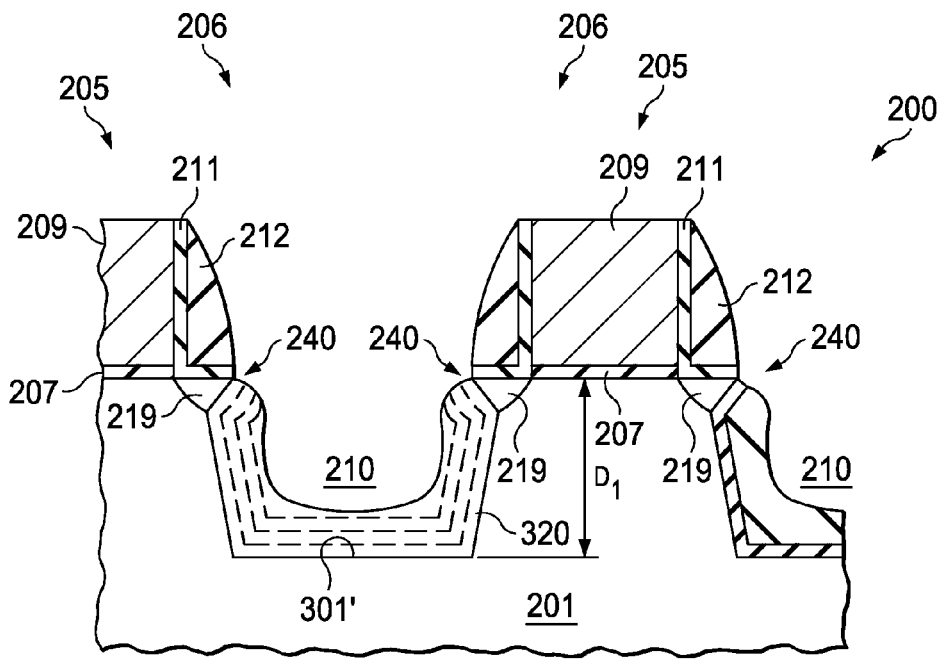
FIG. 5A shows the growth of a silicon-containing layer with the CDE unit cycles, in accordance with some embodiments.

FIG. 5A shows the growth of silicon-containing layer 215 with the CDE unit cycles, in accordance with some embodiments. FIG. 5A shows a schematic diagram of epitaxial film growth of CDE unit cycles, in accordance with some embodiments. FIG. 5A shows that the first two CDE unit cycles (cycles I and II) with lower E/D ratios enable the growth of the silicon-containing layer with greatly reduced effect of particles 320. After the first two cycles, particles 320 are buried in the deposited layer and the impact of particles 320 is reduced to almost none. The following CDE unit cycles (cycles III, IV, . . . ) can use a higher E/D ratio to grow high-quality silicon-containing film. Although the number of CDE unit cycles with lower E/D ratio is two, the CDE unit cycles with lower E/D ratio (or ratios) could be more than 2 cycles or just one cycle.

Figure 5B:
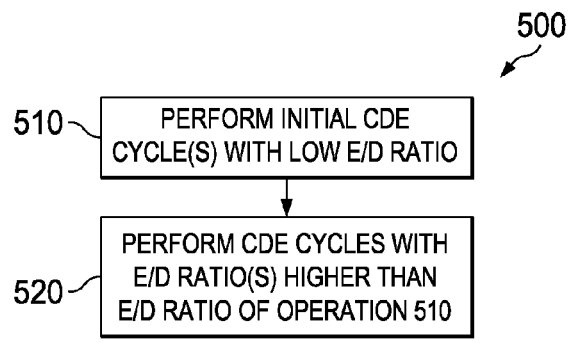
FIG. 5B shows a process flow of an asymmetric CDE process, in accordance with some embodiments.

FIG. 5B shows a process flow 500 of an asymmetric CDE process, in accordance with some embodiments. The CDE process starts at operation 510 by performing initially with a number, such as 1 or 2, of CDE unit cycles with lower etch/deposition ratio(s). The E/D ratios can be the same or different in each CDE unit cycle, if there is more than one CDE unit cycle. Afterward at operation 520, a number of CDE unit cycles with a higher (than operation 510) etch/deposition ratio(s) are run to complete the formation of epitaxial silicon-containing layer 215. Similarly, the E/D ratios can be the same or different in each CDE unit cycle, if there is more than one CDE unit cycle.

Figure 6A:
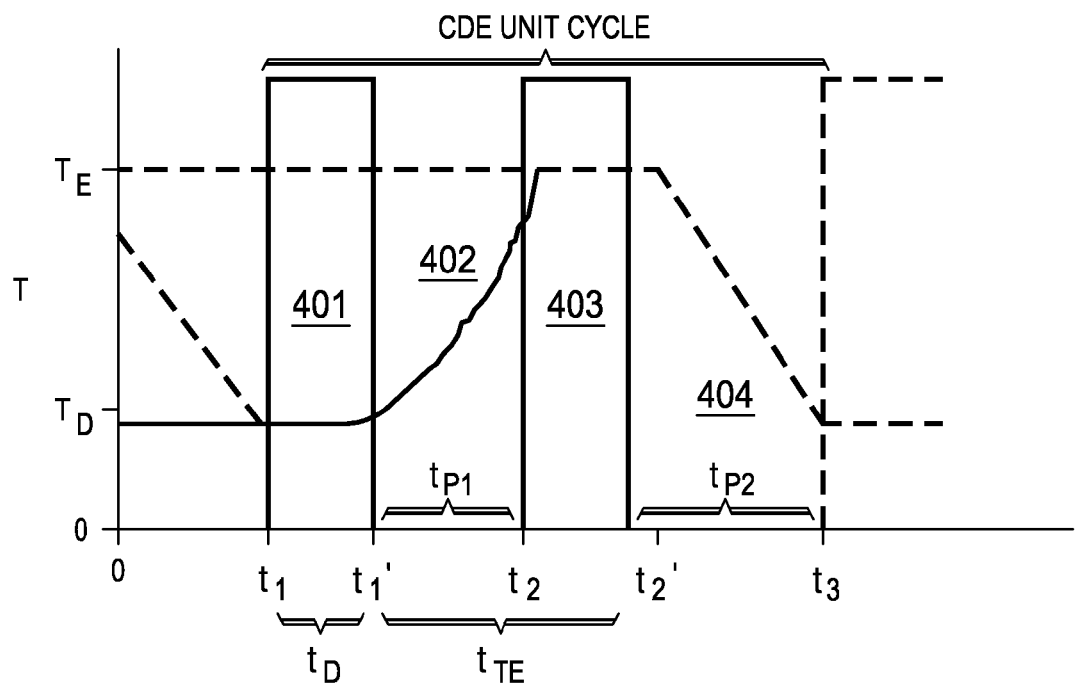
FIG. 6A shows a temperature versus time diagram of a CDE unit cycle, in accordance with some embodiments.
Figure 6B:
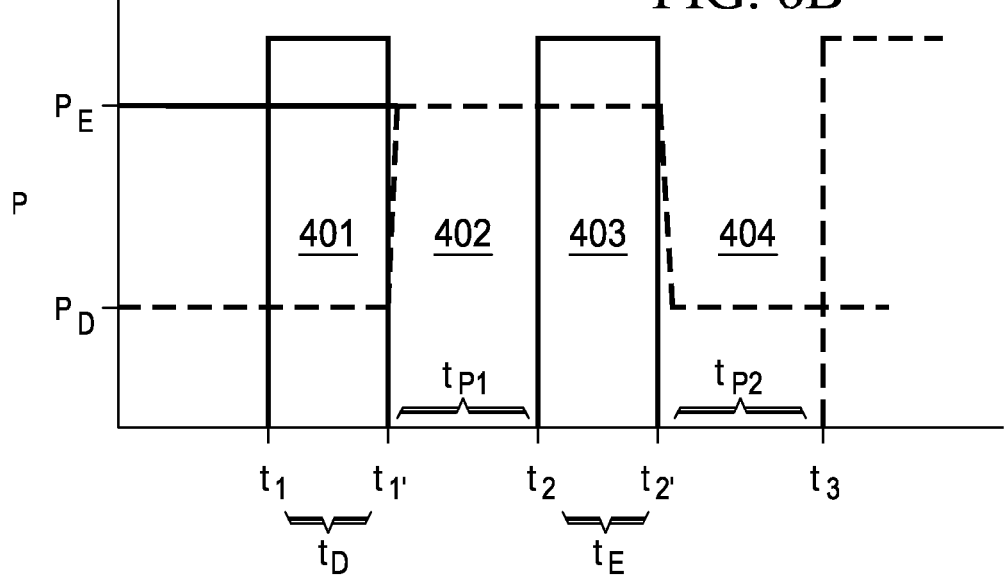
FIG. 6B shows a pressure versus time diagram of a CDE unit cycle, in accordance with some embodiments.

FIG. 6A shows a temperature diagram as a function of process time of a CDE unit cycle, in accordance with some embodiments. FIG. 6A shows that the deposition occurs at $T_D$ and the isothermal etch occurs at $T_E$. FIG. 6B shows a pressure diagram as a function of process time of a CDE unit cycle, in accordance with some embodiments. FIG. 6B shows that the deposition pressure occurs at $P_D$ and the isothermal etch operation occurs at $P_E$.

The deposition process gas mixture has been described above. $T_D$ is in a range from about 500° C. to about 590° C., in accordance with some embodiments. $T_E$ is in a range from about 600° C. to about 750° C., in accordance with some embodiments. $P_D$ is in a range from about 5 Torr to about 500 Torr, in accordance with some embodiments. $P_E$ is in a range from about 10 Torr to about 500 Torr, in accordance with some embodiments. The flow rate of HCl is in a range from about 5 sccm to about 50 slm (standard liters per minute). A non-reactive carrier gas, such as an inert gas, or $N_2$, is also used in the etch gas mixture in accordance with some embodiments. In some embodiments, the carrier gas a flow rate in a range from about 2 slm to about 10 slm.

The deposition process starts at $t_1$ and occurs for the duration of $t_D$. As mentioned above, the deposition time ($t_D$) is in a range from about 3 seconds to about 20 seconds. The etch gas mixture is introduced into the process chamber after the supply of the deposition gas mixture is terminated (at $t_1'$) at the end of the deposition process. As shown in FIG. 6B, the pressure of the chamber is increased to $P_E$ soon after $t_1'$. As shown in FIG. 6A, the temperature of the process chamber increases from $T_D$ to $T_E$, which is a set etch temperature over a period of time, $t_{p1}$, during which the temperature ramp-up operation 402 occurs.

As mentioned above, $T_D$ is in a range from about 500° C. to about 590° C. and $T_E$ is in a range from about 600° C. to about 750° C., in accordance with some embodiments. The dissociation rate and reactivity of HCl increases with temperature. HCl dissociates into hydrogen and chlorine at high temperature. The etch rate of HCl becomes significant at a temperature near 600° C. However, the HCl dissociation rate and reactivity are not negligible at 500° C. Therefore, HCl in the etch gas or gas mixture etches the deposited silicon-containing material deposited in the same CDE unit cycle starting at the beginning of the temperature ramp-up operation (402) between $t_1'$ to $t_2$ and continues till $t_2'$, in accordance with some embodiments. By allowing the etch process to occur during the "pump" operation (or ramp-up operation) after the deposition step, the etch time can be shortened. In some embodiments, the total etch time, $t_{TE}$, is in a range from about 20 seconds to about 50 seconds. In some embodiments, the isothermal etch time, $t_E$, is in a range from about 2 seconds to about 30 seconds. A short etch time, $t_{TE}$, would shorten the overall process time of a CDE unit cycle and consequently the overall process time of the CDE process.

As mentioned above, the etch process starts during the temperature ramp-up operation. To reduce etch amount, which reduces E/D ratio, the HCl flow rate is reduced during temperature ramp-up operation (402), in accordance with some embodiments. In some other embodiments, HCl flow rate is reduced in both the temperature ramp-up operation (402) and the following isothermal etch operation (403). In some embodiments, the HCl flow rate is reduced in a range from about 5% to about 20%. The boundary condition of E/D ratio reduction is keeping a high etch selectivity of amorphous silicon-containing material 215* to silicon-containing material 215.

The CDE process with varying temperature and pressure profiles described above is merely an example. CDE processes with different temperature and pressure profiles may also be used. For example, the CDE process could operate isothermally and under isobaric conditions during the entire CDE unit cycle. Even if the deposition and etch operations in a CDE unit cycle are operated under different temperatures and pressure, the etch gas is turned on only during the isothermal etch operation, in a accordance with some embodiments. The E/D ratios can be changed by adjusting HCl flow rates at different CDE unit cycles in manners similar to those described above.

Figure 7:
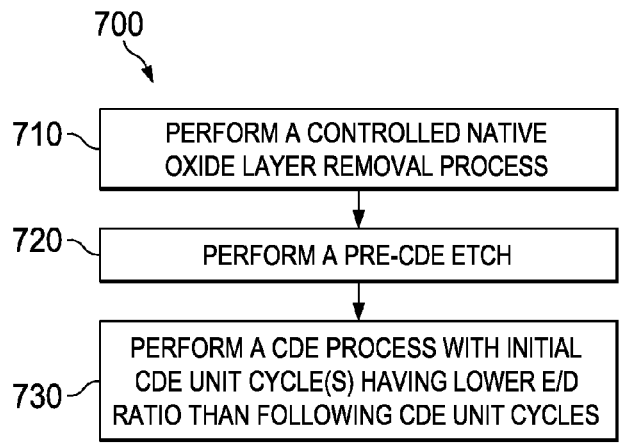
FIG. 7 shows a process sequence of reducing particles and impacts of particles in forming an epitaxial silicon-containing layer, in accordance with some embodiments.

FIG. 7 shows a process sequence 700 of reducing particles and impacts of particles in forming an epitaxial silicon-containing layer 215 after the formation of recesses 210, in accordance with some embodiments. At operation 710, a controlled removal of native oxide layer 310 grown on the cleaned recess surfaces is performed. As mentioned above, the native oxide grows on the cleaned recess surfaces due to exposure of the cleaned silicon surface to air. The controlled removal of native oxide layer 310, which has been described above, reduces additional particles 320 resulting from over-etch. At operation 720, a pre-CDE etch is performed to further reduce the number of particles on the surface of recesses 210. At operation 730, a CDE process with reduced E/D ratio(s) in the initial CDE unit cycle(s) is performed to reduce the cover and to reduce the effect of particles on the epitaxial growth of silicon-containing layer 215. The CDE process at operation 730 has been described above. Although the process sequence 700 described above involves the mechanisms to reduce particles and their effects on epitaxial growth, one or two of the three mechanisms could be used, instead of all 3 mechanisms. By using all or combination of the 3 mechanisms described, particles and effects of particles on the epitaxial growth of the silicon-containing layer 215 are greatly reduced. In some embodiments, the number of particles in the recesses for epitaxial growth is less than about 10 in a die. In some embodiments, the number of particles in the recesses for epitaxial growth is less than about 3 in a die.

The embodiments of mechanisms for forming source/drain (S/D) regions of field effect transistors (FETs) described enable forming an epitaxially grown silicon-containing layer with a reduced number of particles on a surface of recesses. The described mechanisms also reduce the effect of the residual particles on the epitaxial growth. The mechanisms include controlled etch of a native oxide layer on the surfaces of recesses to reduce creation of particles, and pre-CDE etch to remove particles from the surface. The mechanisms also include reduced etch/deposition ratio(s) of initial CDE unit cycle(s) of a CDE process to reduce the effect of residual particles on the formation of the epitaxially grown silicon-containing layer. With the application of one or more of the mechanisms, the quality of the epitaxial layer is improved.

In some embodiments, a method of growing an epitaxial layer is provided. The method includes forming a plurality of gate structures over a substrate, and removing portions of the substrate to form recesses adjacent to the plurality of gate structures. The method also includes removing a native oxide layer formed on surfaces of the recesses with a controlled over-etch amount. The method further includes performing a pre-deposition clean to remove particles on surfaces of the recesses after removing the native oxide layer. In addition, the method includes performing an asymmetric cyclic deposition and etching (CDE) process to form the epitaxial layer. Initial CDE unit cycles have lower etch to deposition ratio than remaining CDE unit cycles.

In some other embodiments, a method of growing an epitaxial layer is provided. The method includes forming a plurality of gate structures over a substrate, and removing portions of the substrate to form recesses adjacent to the plurality of gate structures. The method also includes removing a native oxide layer formed on surfaces of the recesses with a controlled over-etch amount, and performing a pre-deposition clean to remove particles on surfaces of the recesses after removing the native oxide layer. The method further includes performing an asymmetric cyclic deposition and etching (CDE) process to form the epitaxial layer, and initial CDE unit cycles have lower etch to deposition ratio than remaining CDE unit cycles. The removing a native oxide layer, the performing a pre-deposition clean, and the performing an asymmetric CDE process are processed in an integrated system without exposing the substrate to air after the native oxide layer is removed.

In yet some other embodiments, an integrated circuit is provided. The integrated circuit includes a gate structure disposed over a substrate. The integrated circuit also includes a silicon-containing material structure formed in and over a recess adjacent to the gate structure. The silicon-containing material structure includes a first epitaxial layer and a second epitaxial layer, and a total number of particle defects in the recesses is less than about 3 in a die.

According to an embodiment, a method of forming a semiconductor device, the method comprises forming a gate structure over a substrate, and removing portions of the substrate to form recesses adjacent to the gate structure. The method further comprises performing an asymmetric cyclic deposition and etching (CDE) process to form an epitaxial layer in the recesses, wherein initial CDE unit cycles have a lower etch to deposition ratio than one or more subsequent CDE unit cycles.

According to another embodiment, a method of forming a semiconductor device, the method comprises providing a substrate having a gate structure formed thereon, the substrate having recesses adjacent to the gate structure, and removing an oxide layer from surfaces of the recesses. The method further comprises performing an asymmetric cyclic deposition and etching (CDE) process to form a first epitaxial layer in the recesses, wherein initial CDE unit cycles have a lower etch to deposition ratio than one or more subsequent CDE unit cycles, and wherein the removing the oxide layer and the performing the asymmetric CDE process are performed without exposing the substrate to air after the oxide layer is removed.

According to yet another embodiment, a method of forming a semiconductor device, the method comprises providing a substrate having a gate structure formed thereon, the substrate having recesses adjacent to the gate structure, and performing a pre-deposition clean to remove particles on surfaces of the recesses. The method further comprises performing an asymmetric cyclic deposition and etching (CDE) process to form an epitaxial layer in the recesses, wherein one or more initial CDE unit cycles have a lower etch to deposition ratio than one or more subsequent CDE unit cycles.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a gate structure over a substrate;
   removing portions of the substrate to form recesses adjacent to the gate structure; and
   performing an asymmetric cyclic deposition and etching (CDE) process to form an epitaxial layer in the recesses, wherein initial CDE unit cycles have a lower etch to deposition ratio than one or more subsequent CDE unit cycles.

2. The method of claim 1, further comprising prior to performing the asymmetric CDE process removing a native oxide layer formed on surfaces of the recesses.

3. The method of claim 2, wherein the removing the native oxide layer comprises performing a plasma etch process with a gas mixture including $NF_3$ and $NH_3$.

4. The method of claim 3, wherein the removing the native oxide layer further comprising preforming a thermal anneal to remove byproducts of the plasma etch process.

5. The method of claim 1, further comprising prior to performing the asymmetric CDE process performing a pre-deposition clean to remove particles on surfaces of the recesses.

6. The method of claim 5, wherein the pre-deposition clean uses HCl to remove particles on the surfaces of the recesses.

7. The method of claim 1, wherein an etch gas flow rate is lower in the initial CDE unit cycles than in the one or more subsequent CDE unit cycles to enable the lower etch to deposition ratio in the initial CDE unit cycles.

8. The method of claim 1, wherein the asymmetric CDE process further comprises in situ doping the epitaxial layer.

9. A method of forming a semiconductor device, the method comprising:
   providing a substrate having a gate structure formed thereon, the substrate having recesses adjacent to the gate structure;
   removing an oxide layer from surfaces of the recesses; and
   performing an asymmetric cyclic deposition and etching (CDE) process to form a first epitaxial layer in the recesses, wherein initial CDE unit cycles have a lower etch to deposition ratio than one or more subsequent CDE unit cycles, and wherein the removing the oxide layer and the performing the asymmetric CDE process are performed without exposing the substrate to air after the oxide layer is removed.

10. The method of claim 9, further comprising prior to performing the asymmetric CDE process performing a pre-deposition clean to remove particles on surfaces of the recesses.

11. The method of claim 10, wherein after performing the pre-deposition clean a total number of particles in the recesses is less than about 3 in a die.

12. The method of claim 9, wherein an etch process of a first CDE unit cycle is performed at a temperature range higher than a temperature for a deposition process of the first CDE unit cycle.

13. The method of claim 12, wherein the etch process is performed at a pressure higher than a pressure for the deposition process.

14. The method of claim 9, further comprising preforming a selective epitaxial growth (SEG) process to form a second epitaxial layer over the first epitaxial layer.

15. A method of forming a semiconductor device, the method comprising:
   providing a substrate having a gate structure formed thereon, the substrate having recesses adjacent to the gate structure;
   performing a pre-deposition clean to remove particles on surfaces of the recesses; and
   performing an asymmetric cyclic deposition and etching (CDE) process to form an epitaxial layer in the recesses, wherein one or more initial CDE unit cycles have a lower etch to deposition ratio than one or more subsequent CDE unit cycles.

16. The method of claim 15, further comprising prior to performing the pre-deposition clean removing a native oxide layer formed on the surfaces of the recesses.

17. The method of claim 16, wherein the recesses are formed in the substrate using a wet etching process, and wherein removing the native oxide layer comprises using a dry etching process.

18. The method of claim 15, wherein the epitaxial layer is a silicon-containing layer doped with phosphorus and carbon.

19. The method of claim 15, wherein an etch gas is introduced into a process chamber of the asymmetric CDE process after a deposition process of a first CDE unit cycle is done, and wherein a temperature of an etch process of the first CDE unit cycle increases to a target value during the etch process.

20. The method of claim 15, wherein a deposition gas flow is maintained at a same level in every CDE unit cycle of the asymmetric CDE process.

* * * * *